United States Patent
Itoh et al.

(10) Patent No.: US 6,621,234 B2
(45) Date of Patent: Sep. 16, 2003

(54) PLASMA DISPLAY DEVICE WITH ALTERNATELY ARRANGED SUSTAIN ELECTRODES

(75) Inventors: Katsumi Itoh, Kawasaki (JP); Yoshinori Okada, Kawasaki (JP); Hideaki Ohki, Yokohama (JP); Tomokatsu Kishi, Kawasaki (JP)

(73) Assignee: Fujitsu Hitachi Plasma Display Limited, Kawasaki (JP)

( * ) Notice: Subject to any disclaimer, the term of this patent is extended or adjusted under 35 U.S.C. 154(b) by 0 days.

(21) Appl. No.: 09/875,921

(22) Filed: Jun. 8, 2001

(65) Prior Publication Data

US 2002/0047586 A1 Apr. 25, 2002

(30) Foreign Application Priority Data

Jul. 18, 2000 (JP) ........................................ 2000-217786

(51) Int. Cl.[7] .................................................. G09G 3/10
(52) U.S. Cl. ..................... 315/169.4; 313/306; 313/581
(58) Field of Search ............................ 315/169.1, 169.4, 315/169.2; 313/581, 306, 307, 582, 583, 584, 585; 345/60, 37, 41, 42

(56) References Cited

U.S. PATENT DOCUMENTS 6,218,784 B1 * 4/2001 Jang et al. ............... 315/169.1

FOREIGN PATENT DOCUMENTS

| JP | 9-160525 | 6/1997 |
| JP | 11-327458 | 11/1999 |
| JP | 11-327503 | 11/1999 |

* cited by examiner

*Primary Examiner*—Don Wong
*Assistant Examiner*—Thuy Vinh Tran
(74) *Attorney, Agent, or Firm*—Staas & Halsey LLP

(57) ABSTRACT

The plasma display panel includes a pair of glass substrates forming therein display cells. One substrate has address electrodes and the other has sustain electrodes including X-electrodes and Y-electrodes. X-electrodes are connected to terminals of sustain pulse generating circuits provided on a printed circuit board, via intermediate circuit boards. The printed circuit board and the intermediate circuit boards are connected to each other by connectors having a first set of terminals connected to the first sustain pulse generating circuit and a second set of terminals connected to the second sustain pulse generating circuit. Terminals of first and second sets are arranged in a row alternately one by one, or group by group.

19 Claims, 13 Drawing Sheets

PLASMA DISPLAY DEVICE WITH ALTERNATELY ARRANGED SUSTAIN ELECTRODES

BACKGROUND OF THE INVENTION

1. Field of the Invention

The present invention relates to a plasma display device.

2. Description of the Related Art

An AC plasma display device (PDP) comprises two opposed glass substrates, a plurality of address electrodes, arranged on one of the glass substrates, parallel to each other, and a plurality of sustain electrodes, arranged on the other glass substrate, to extend parallel to each other and perpendicular to the address electrodes. The sustain electrodes include alternately arranged X-electrodes and Y-electrodes. A display cell is formed between an X-electrode and a Y-electrode which are adjacent to each other.

In one display cell, a writing voltage pulse is supplied between the address electrode and the Y-electrode to cause electric discharge to generate a priming, and a sustain discharge voltage pulse is supplied between the X-electrode and the Y-electrode to sustain the discharge to illuminate the display cell.

The X-electrodes are classified into odd number X-electrodes and even number X-electrodes, which are connected to respective X-electrode sustain pulse generating circuits. The Y-electrodes are connected to an H side circuit and an L side circuit of a Y-electrode sustain pulse generating circuit via a scanning driver. The scanning driver has ground terminals (GND) and high voltage terminals (HVcc); the H side circuit is connected to the ground terminals, and the L side circuit is connected to the high voltage terminals. The address electrodes are connected to an address electrode pulse generating circuit. Respective pulse generating circuits are mounted to printed circuit boards and connected to the address electrodes and the sustain electrodes (X-electrodes and Y-electrodes) on the glass substrate via printed circuit boards and flexible printed circuit boards (FPC).

The above described type AC plasma display device is disclosed, for example, in Japanese Unexamined Patent Publications No. 9-160525, No. 11-327503 and No. 11-327458.

FIGS. 13 and 14 show the prior art. In FIGS. 13 and 14, there are intermediate circuit boards 38H and 40H between a printed circuit board 36H and a plasma display panel, and connectors 42H are provided for the intermediate circuit boards 38H and 40H. The connector 42H has pins 43a and 43b provided on a part of the intermediate circuit boards 38H and 40H, and holes 36a and 36b provided in the printed circuit board 36H. In the connector 42H, a group of the terminals 43a–36a for the odd number X-electrodes and a group of the terminals 43b–35b for the even number X-electrodes are arranged such that the connector 42H is roughly divided into two portions. An arrow 44H shows a line, regarding a specific odd number X-electrode 18x, which is laid from the first (odd number) sustain pulse generating circuit 24H to the odd number X-electrode 18x on the glass substrate 14 via the printed circuit board 36H, the connector 42H and the intermediate circuit board 38H. In this case, the line 44H greatly extends round upward, and the line length of the conductor is increased. Accordingly, the impedance becomes higher. The printed circuit board 36H is a multi-layered printed circuit board having two conductor pattern layers 36p and 36q.

As the size of the plasma display device is increased, the size of the glass substrates is increased. Accordingly, a difference between the size of the glass substrates and that of each printed circuit board is increased. As a result, it becomes difficult to connect the X-electrodes and Y-electrodes with the printed circuit boards concerned. For example, in the case where the length of one side of the printed circuit boards relating to the X-electrodes and the Y-electrodes is 30 cm and the length of one side of the glass substrates is 50 to 70 cm, it becomes difficult to connect the terminals of the printed circuit boards with the X-electrodes and the Y-electrodes without causing any problems. In order to solve the above problems, it is preferable that an intermediate circuit board is provided between the printed circuit board and the X-circuit board and also between the printed circuit board and the Y-circuit board. The conductor pattern on the printed circuit board and that on the intermediate circuit board are connected with each other by a connector.

In the connector provided between the printed circuit board for the X-electrodes and the intermediate circuit board, as shown in FIGS. 13 and 14, a group of the conductor patterns connected to the printed circuit board for the first X-electrodes extend to the first portion of the connector, and a group of the conductor patterns connected to the printed circuit board for the second X-electrodes extend to the second portion of the connector. That is, in the connector, a group of the terminals for the odd number X-electrodes are arranged, and a group of the terminals for the even number X-electrodes are arranged next to them. Due to the above arrangement, the connector can be easily connected. In the same manner, concerning the Y-electrodes, there are provided a group of the terminals connected to the Y sustain pulse generating circuit H side circuit and a group of the terminals connected to the Y sustain pulse generating circuit L side circuit.

However, the following problems occur; according to the positions of the terminals of the X-electrode and the Y-electrode, a distance between the sustain pulse generating circuit and the connector terminals and a distance between the connector terminals and the X-electrode are changed. Accordingly, the lengths of the lead lines communicating with the X-electrodes and Y-electrodes located at specific positions are increased. As a result, the impedance becomes higher. Therefore, the impedance fluctuates and also the voltage drop fluctuates in the case of discharge. Accordingly, the time and intensity of sustain discharge fluctuate greatly, which causes unevenness on the display and further causes a difference in luminance at each position on the display, that is, the quality of the display is deteriorated.

SUMMARY OF THE INVENTION

An object of the present invention is to provide a plasma display device by which the quality of display can be enhanced, by reducing the fluctuation of impedance.

The present invention provides a plasma display device comprising a plasma display panel having at least a plurality of sustain electrodes for emission of light, a printed circuit board having a first sustain pulse generating circuit for supplying a first sustain discharge pulse to a first group of electrodes in the plurality of sustain electrodes and a second sustain pulse generating circuit for supplying a second sustain discharge pulse to a second group of electrodes in the plurality of sustain electrodes, and at least one intermediate circuit board arranged between the printed circuit board and the plasma display panel to connect the sustain pulse generating circuits to the sustain electrodes, wherein the printed circuit board and at least one intermediate circuit board are connected to each other by at least one connector, the connector including a first set of terminals connected to the first sustain pulse generating circuit and a second set of terminals connected to the second sustain pulse generating circuit, the terminals of the first and second sets being arranged in a row alternately one by one or one group by one group.

According to this structure, with respect to the X-electrodes and Y-electrodes arranged at specific positions, fluctuation of the length of the leads can be reduced and also fluctuation of the impedance of the leads can be reduced. As a result, unevenness on the display, which looks like mold, can be suppressed, and further a difference in brightness at each position of the display cell is not increased. Therefore, the quality of display can be enhanced.

It is preferable that the printed circuit board comprises a multi-layered printed board. It is more preferable that the printed circuit board comprises a multi-layered printed board having four conductor pattern layers or having not less than four conductor pattern layers. When the multi-layered printed board is used, it is possible to increase the line width of the lead. Therefore, the impedance can be reduced.

BRIEF DESCRIPTION OF THE DRAWINGS

The present invention will become more apparent from the following description of the preferred embodiments, with reference to the accompanying drawings, in which.

DESCRIPTION OF THE PREFERRED EMBODIMENTS

Figure 1:
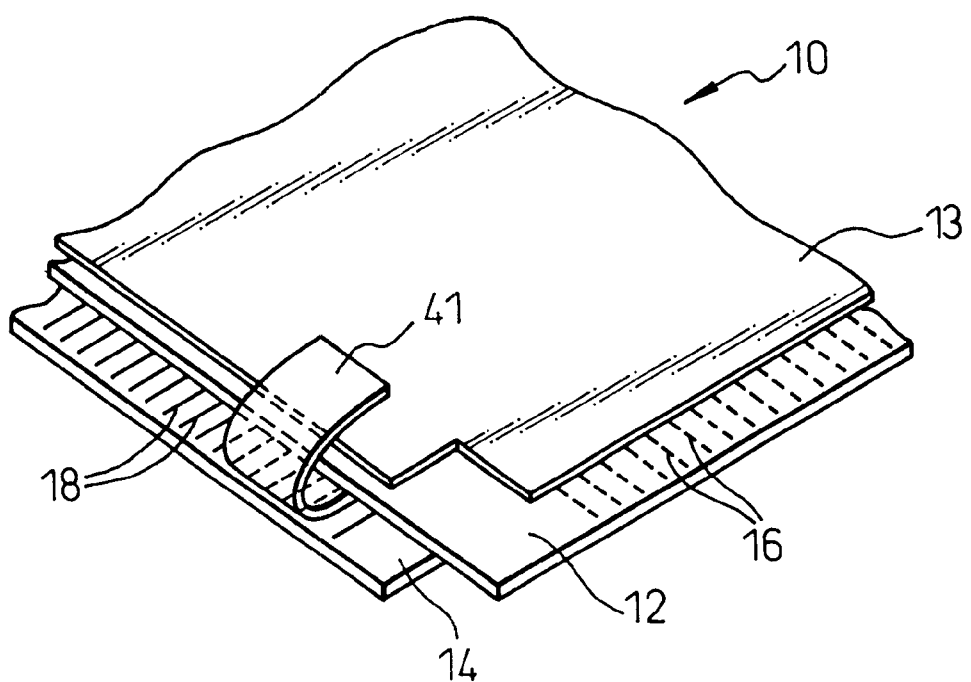
FIG. 1 is a perspective view showing a part of a plasma display device of the first embodiment of the present invention.
Figure 2:
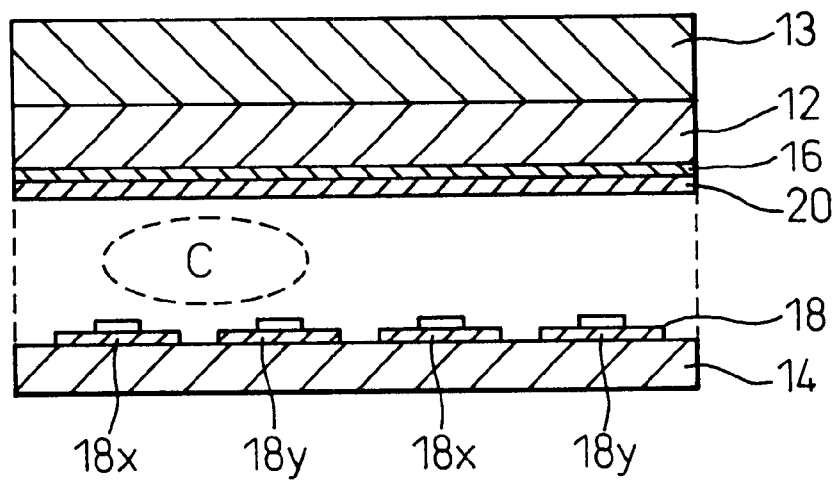
FIG. 2 is a cross-sectional view of the plasma display device of FIG. 1.
Figure 3:
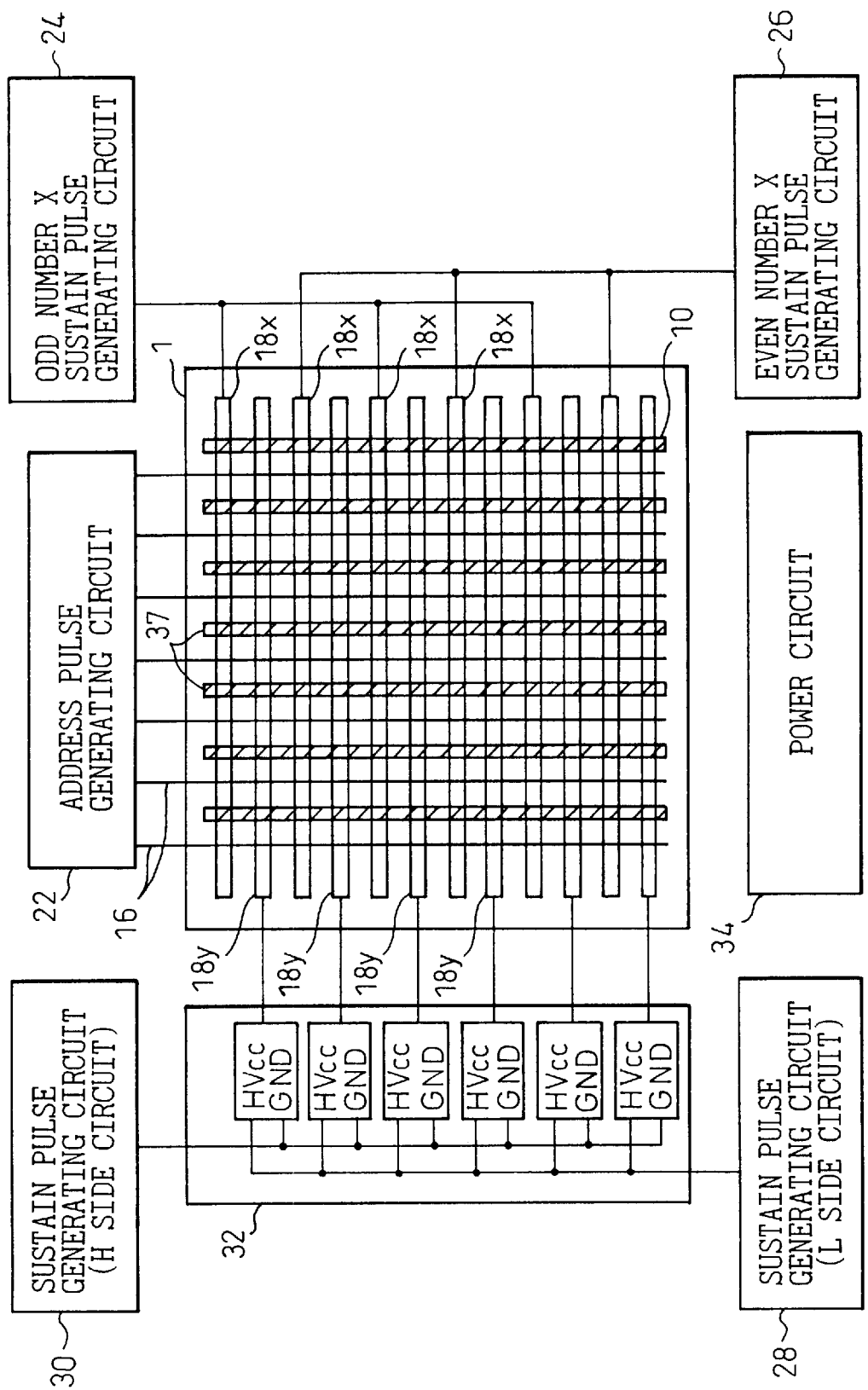
FIG. 3 is a view showing address electrodes, sustain electrodes and sustain pulse generating circuits of the plasma display device shown in FIGS. 1 and 2.

Referring to the appended drawings, embodiments of the present invention will now be explained. FIG. 1 is a perspective view of a plasma display device of the first embodiment of the present invention. FIG. 2 is a cross-sectional view of the plasma display device shown in FIG. 1. FIG. 3 is a view showing address electrodes, sustain electrodes and sustain pulse generating circuits of the plasma display device shown in FIGS. 1 and 2.

In FIGS. 1 and 2, the plasma display device 10 includes two opposed glass substrates 12 and 14, a plurality of address electrodes 16 arranged, on one glass substrate 12, parallel to each other, and a plurality of sustain electrodes 18 arranged, on the other glass substrate 14, parallel to each other and perpendicular to the address electrodes 16. A plasma display panel is composed of these glass substrates 12 and 14 when they are combined with each other.

In this embodiment, the sustain discharge electrode 18 is composed in such a manner that a thin conductor is put on a transparent electrode strip, and a fluorescent material 20 is formed on the address electrode 16 for conducting color display. A protective film is formed to cover the address electrodes 16, the fluorescent material 20 and the sustain electrodes 18. The side of the glass substrate 14 is a display side. A chassis 13 is attached to the glass substrate 12 to mount the sustain pulse generating circuits and others thereon.

In FIG. 3, the sustain electrodes 18 include X-electrodes 18x and Y-electrode 18y which are alternately arranged. That is, the sustain electrodes 18 include, in the order from the top to the bottom in FIG. 3, a first X-electrode 18x, a first Y-electrode 18y, a second X-electrode 18x, a second Y-electrode 18y, a third X-electrode 18x, a third Y-electrode 18y, a fourth X-electrode 18x, and a fourth Y-electrode 18y, and so on.

The plasma display device 10 further includes an address pulse generating circuit 22, X-electrode sustain pulse generating circuits 24 and 26, Y-electrode sustain pulse generating circuits 28 and 30, a scanning circuit 32, and an electric power supply circuit 34. The pulse generating circuits 22 to 30 are connected to the electric power supply circuit 34 and a control circuit not shown in the drawing. The address pulse generating circuit 22 supplies a drive pulse to the address electrodes 16. The sustain pulse generating circuit 24 supplies a drive pulse to the odd number X-electrodes 18x. The sustain pulse generating circuit 26 supplies a drive pulse to the even number X-electrode 18x. The sustain pulse generating circuits 28 and 30 supply a drive pulse to Y-electrodes 18y via the scanning circuit 32.

Display cell C (shown in FIG. 2) is formed between the X-electrode 18x and the Y-electrode 18y. In one display cell C, a writing high-voltage pulse is supplied between the address electrode 16 and the Y-electrode 18y to cause electric discharge to generate a priming. Then, a sustain discharge voltage pulse is supplied between the X-electrode 18x and the Y-electrode 18y to sustain the discharge to emit a light in the display cell C.

A first discharge gap is formed between the X-electrode 18x and the Y-electrode 18y which are adjacent to each other. A second discharge gap is formed between this Y-electrode 18y and the next X-electrode 18x. In a typical plasma display device, when the display cell C is formed in the first discharge gap, no display cell is formed in the second discharge gap. In an improved type plasma display device, when the phase of the sustain pulse voltage waveform in the first discharge gap and the phase of the sustain pulse voltage waveform in the second discharge gap are applied in reverse to each other, so that when the display cell C is formed in the first electric discharge gap, a display cell C can be also formed in the second discharge gap. In this case, a bulkhead 37 is formed between the adjacent parallel address electrodes 16.

Figure 4:
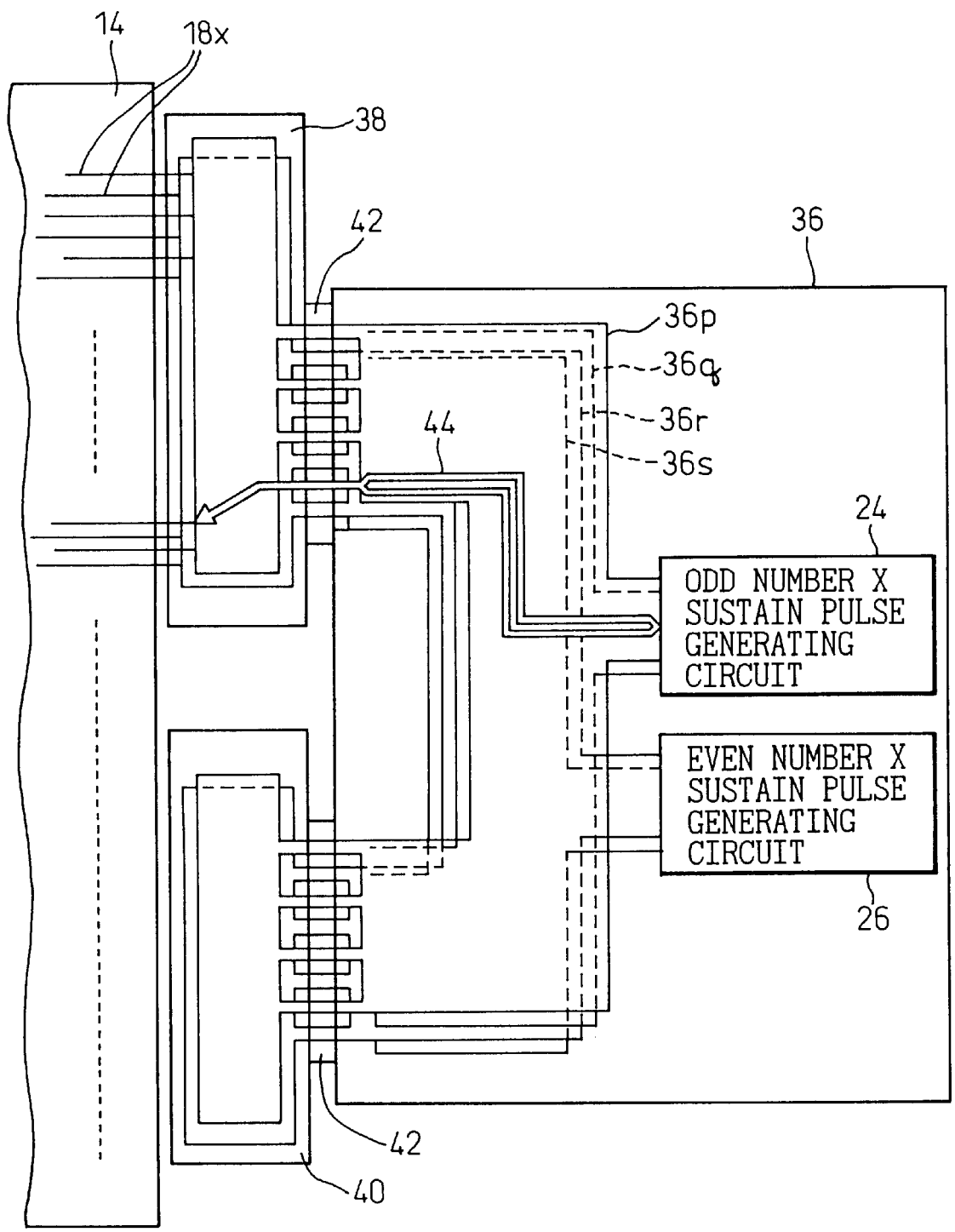
FIG. 4 is a view showing a connection path connecting the X-electrode to the sustain pulse generating circuit in FIG. 1.

FIG. 4 is a block diagram showing a connection path of the X-electrodes 18x of the glass substrate 14 to the sustain pulse generating circuits 24 and 26. The first sustain pulse generating circuit 24 and the second sustain pulse generating circuit 26 are mounted on a printed circuit board 36. The terminals of the first sustain pulse generating circuit 24 are connected to the odd number X-electrodes 18x within all the X-electrodes 18x. The terminals of the second sustain pulse generating circuit 24 are connected to the even number X-electrodes 18x within all the X-electrodes 18x.

The printed circuit board 36 is composed of a multi-layered printed circuit board having four layers of conductor patterns 36p, 36q, 36r and 36s. The first sustain pulse generating circuit 24 is connected to the first layer of conductive pattern 36p and the second layer of conductor pattern 36q from the top, and the second sustain pulse generating circuit 24 is connected to the third layer of conductive pattern 36r and the fourth layer of conductor pattern 36s from the top. In this embodiment, it is preferable that the printed circuit board 36 is composed of a multi-layered printed board having four or not less than four conductor pattern layers.

First and second intermediate circuit boards 38 and 40 are arranged between the printed circuit board 36 and the X-electrodes 18x. The sustain pulse generating circuits 24 and 26, the printed circuit board 36 and the intermediate circuit boards 38 and 40 are attached to the chassis 13 shown in FIG. 1. One flexible printed circuit board 41 is shown in FIG. 1, as an example. Similar flexible print circuit boards 41 are used for connecting the respective printed circuit boards with the address electrodes 16, the X-electrodes 18x and the Y-electrodes 18y. Each intermediate circuit board 38 or 40 is connected to the X-electrodes 18x of the glass substrate 14 via two flexible printed circuit boards 41.

Figure 5:
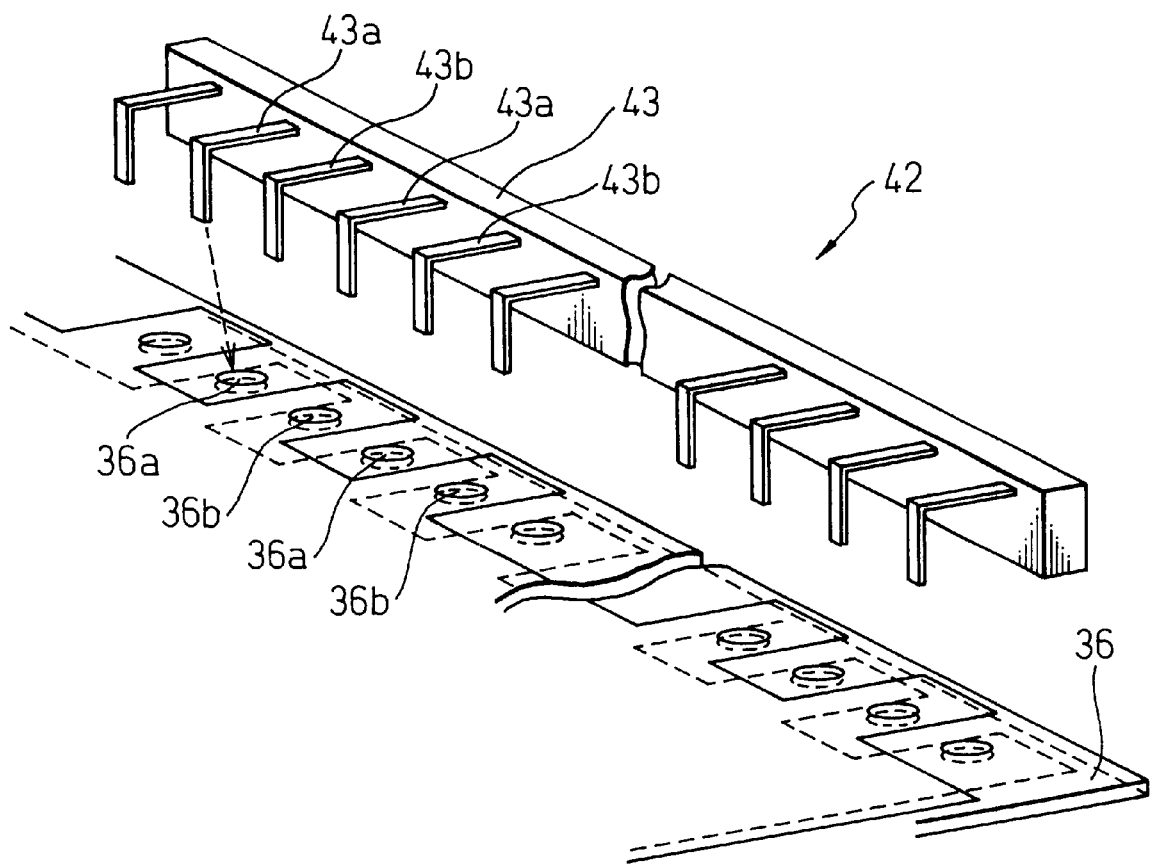
FIG. 5 is a view showing a connector arranged between the printed circuit board and the intermediate circuit board of FIG. 4.
Figure 6:
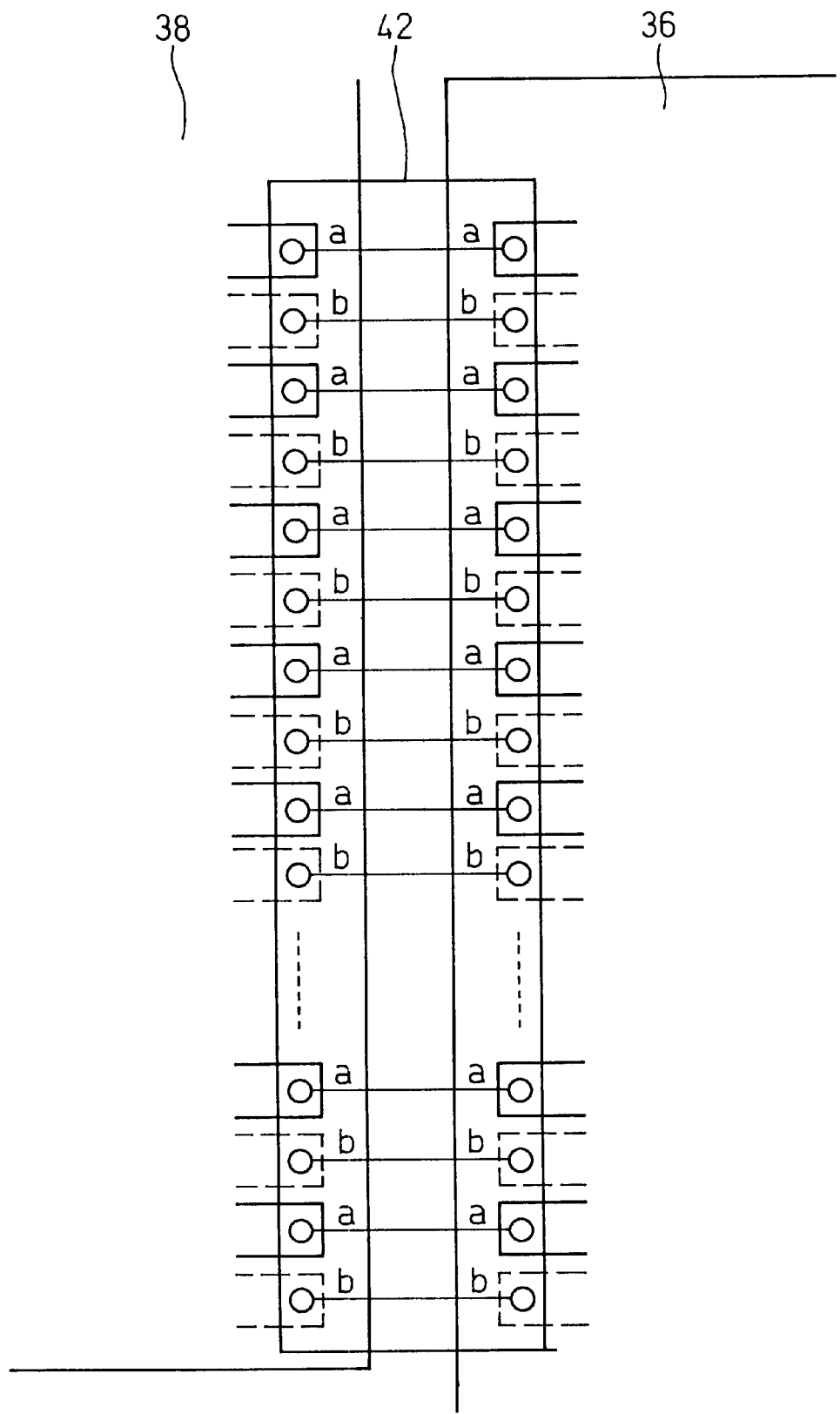
FIG. 6 is a view showing the connector in the coupled condition.

The printed circuit board 36 and the intermediate circuit boards 38 and 40 are connected with each other by connectors 42. FIGS. 5 and 6 show the connector 42.

The connector 42 includes connector pins 43a and 43b extending from a base section 43 fixed to the intermediate circuit board 38 (40), and connector holes (through-holes) 36a and 36b provided in the printed circuit board 36. The connector holes 36a are connected to both the first and second layers of conductor pattern 36p and 36q from the top of the printed circuit board 36. Due to the foregoing, the connector holes 36a are connected to the first sustain pulse generating circuit 24 via the conductor patterns. The connector holes 36a are connected to the odd number X-electrodes 18x within all the X-electrodes 18x. In the same manner, the connector holes 36b are connected to both the third and fourth layers of conductor patterns 36r and 36s from the top of the printed circuit board 36. Due to the foregoing, the connector holes 36b are connected to the second sustain pulse generating circuit 26 via the conductor patterns. The connector holes 36b are connected to the even number X-electrodes 18x within all the X-electrodes 18x.

As can be seen in FIGS. 5 and 6, the connector 42 includes a first set of terminals 43a–36a which are connected to the first sustain pulse generating circuit 24, and a second set of terminals 43b–36b which are connected to the second sustain pulse generating circuit 26. The terminals 43a–36a and 43b–36b of the first set and the second set are arranged in a row alternately one by one.

Figure 7:
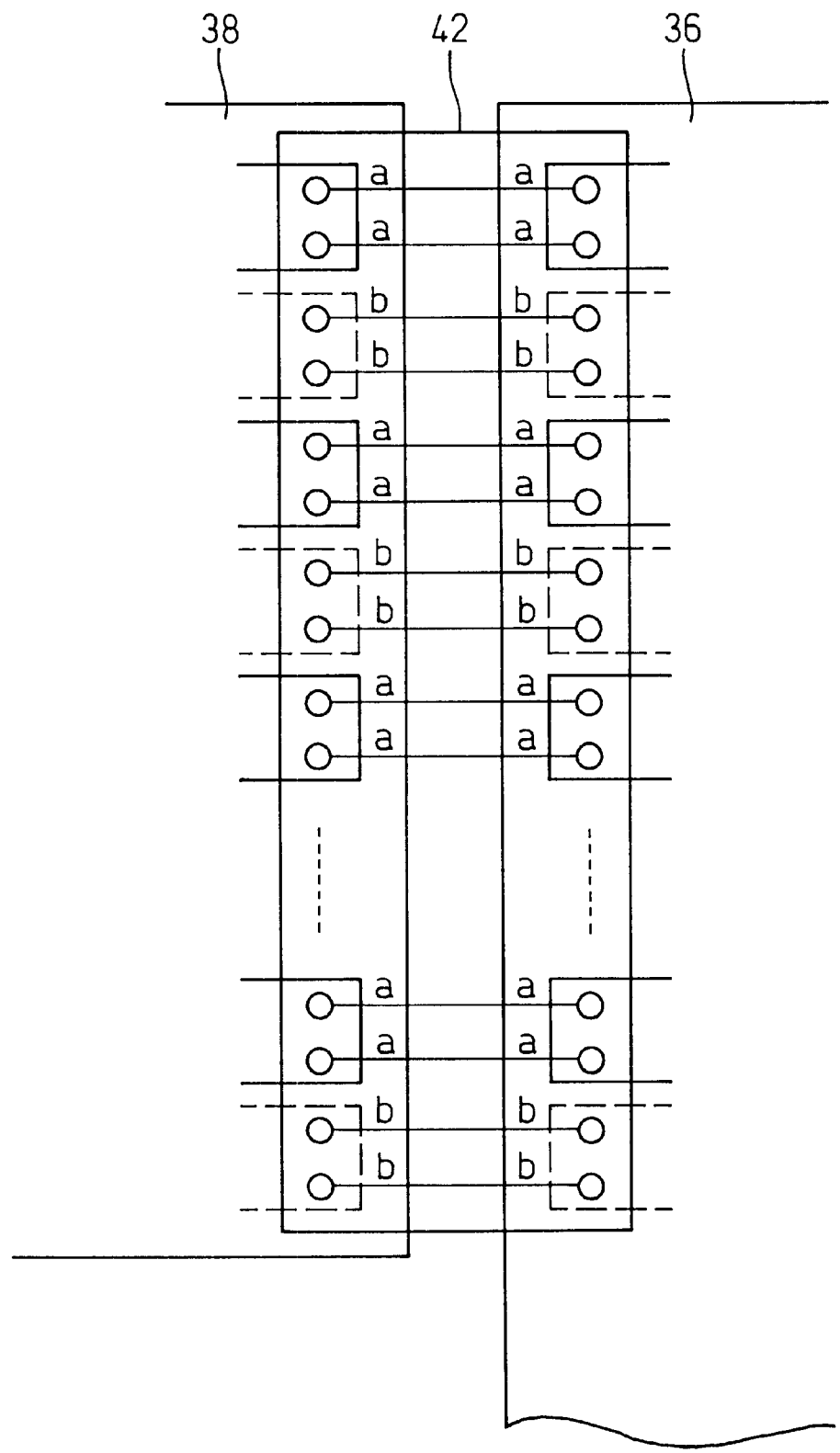
FIG. 7 is a view showing a variation of the connector.

FIG. 7 is a view showing a modification of the connector 42. In FIGS. 6 and 7, the terminals 43a–36a are shown by a—a, and the terminals 43b–36b are shown by b—b. In FIG. 7, the connector 42 includes a first set of terminals 43a–36a which are connected to the first sustain pulse generating circuit 24, and a second set of terminals 43b–36b which are connected to the second sustain pulse generating circuit 26. The terminals 43a–36a and 43b–36b of the first set and the second set are arranged in a row alternately one group by one group. In this case, one group is composed of two sets.

In FIG. 4, the arrow 44 shows a line, regarding a specific odd number X-electrode 18x, which is laid from the first sustain pulse generating circuit 24 to the odd number X-electrode 18x on the glass substrate 14 via the printed circuit board 36, the connector 42 and the intermediate circuit board 38.

Figure 13:
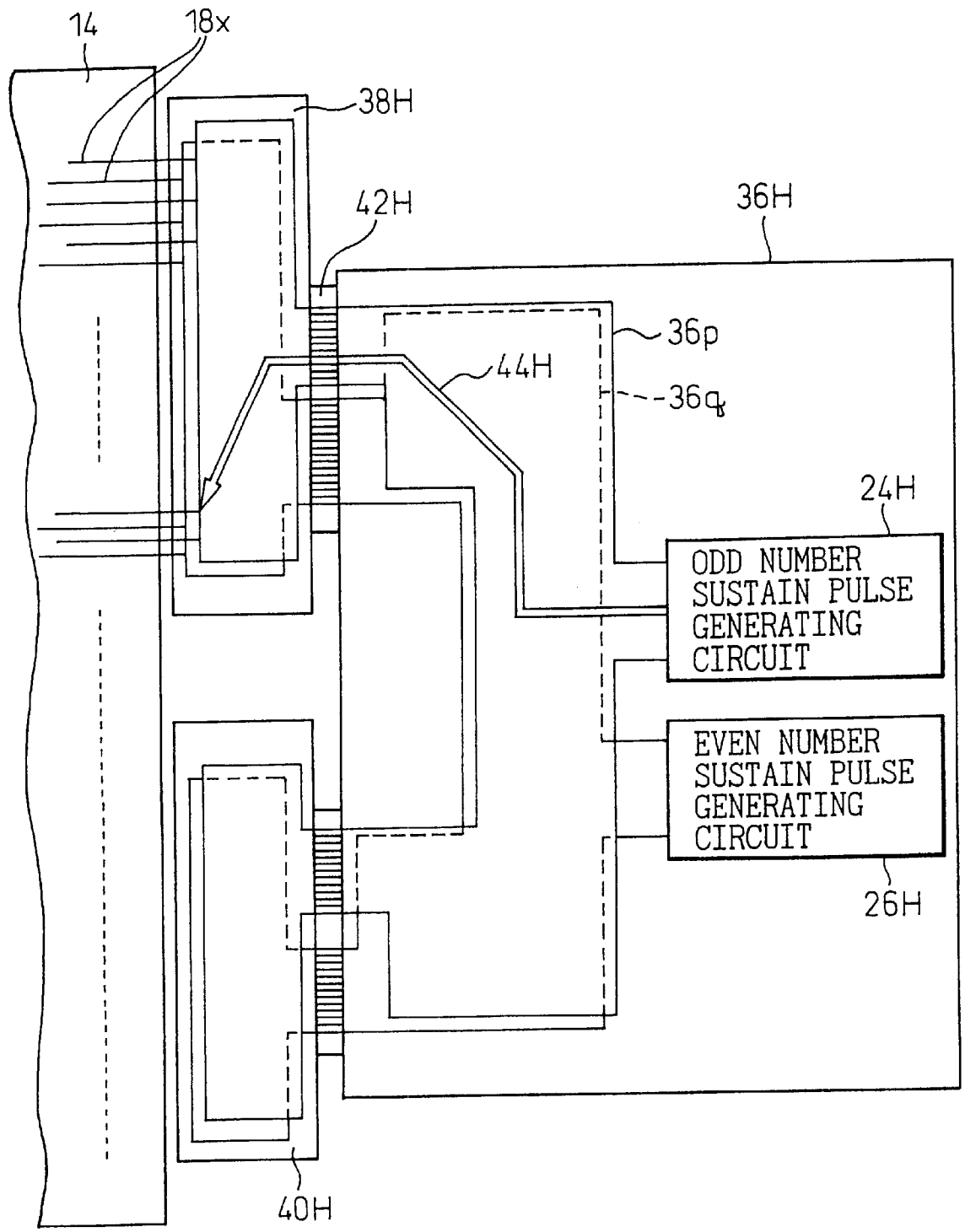
FIG. 13 is a view showing a connection path of the X-electrodes on the glass substrate to the sustain pulse generating circuit of a conventional plasma display device.
Figure 14:
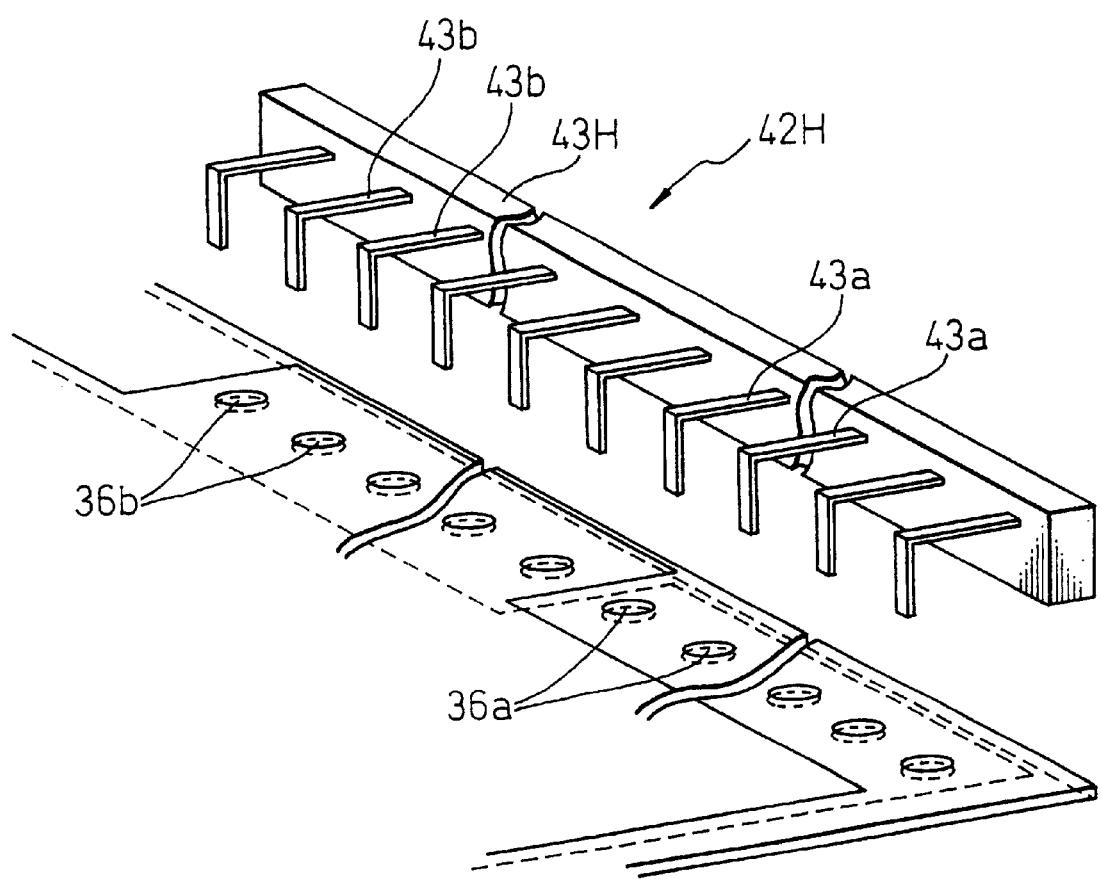
FIG. 14 is a view showing the connector arranged between the printed circuit board and the intermediate circuit board shown in FIG. 3.

In the present invention shown in FIGS. 4 and 5, the length of the conductor line connected to the specific X-electrode 18x is not longer than that shown in FIGS. 13 and 14. Therefore, the impedance is not increased. In this connection, in FIGS. 13 and 14, the character "H" is attached to the reference numerals representing members which are similar to the members shown in FIGS. 4 and 5. When the multi-layered printed board 36 having four layers of conductor pattern is used, the conductors of two layers are allotted to each terminal, so that the impedance can be reduced.

The first intermediate circuit board 38 is explained above, and the second intermediate circuit board 40 can be explained in the same manner. A portion of the terminals connected to the first sustain pulse generating circuit 24 are allotted to the first intermediate circuit board 38, and a remaining portion of the terminals connected to the first sustain pulse generating circuit 24 are allotted to the second intermediate circuit board 40. A portion of the terminals connected to the second sustain pulse generating circuit 26 are allotted to the first intermediate circuit board 38, and a remaining portion of the terminals connected to the second sustain pulse generating circuit 26 are allotted to the second intermediate circuit board 40. As described above, even if a difference in the size between the glass substrate 14 and the printed circuit board 36 is large, the terminals of the multi-layered printed circuit board 36 can be appropriately connected to the X-terminals 18x without causing any problems. Therefore, it becomes possible to provide a large plasma display device.

Figure 8:
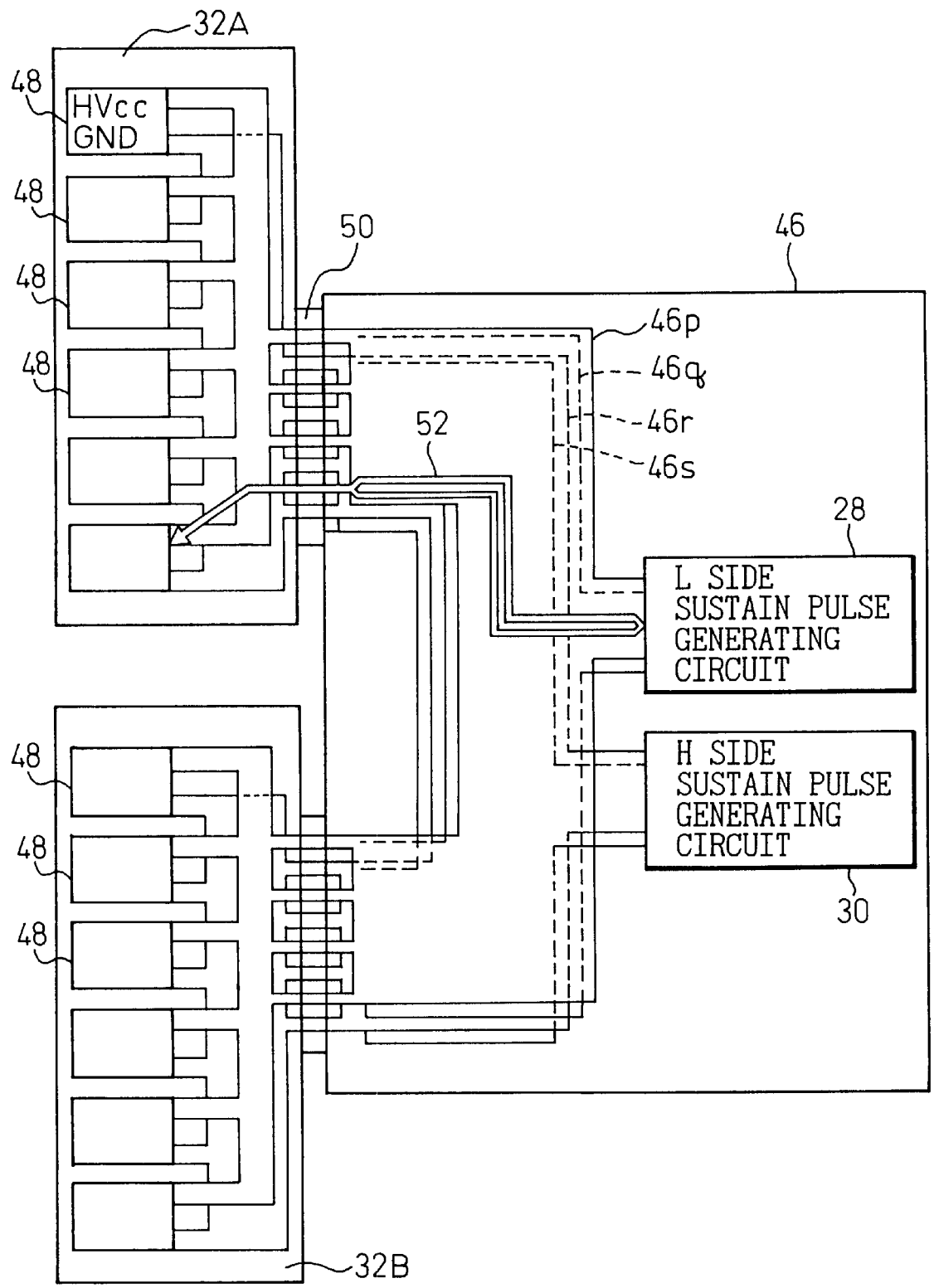
FIG. 8 is a view showing a connection path of the Y-electrodes of the plasma display device with the sustain pulse generating circuits of the second embodiment of the present invention.
Figure 9:
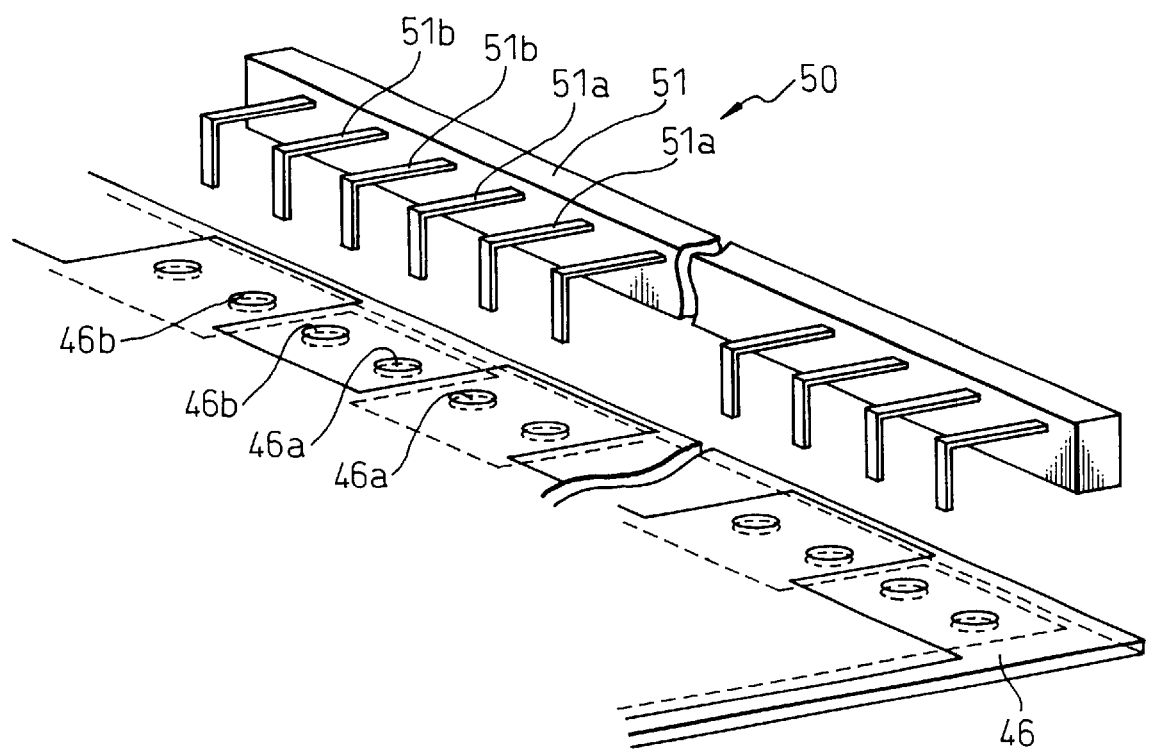
FIG. 9 is a view showing a connector arranged between the printed circuit board and the intermediate circuit board shown in FIG. 8.

FIG. 8 is a block diagram showing a connection path of the Y-electrodes of the plasma display device with the sustain pulse generating circuits of the second embodiment of the present invention. FIG. 9 is a view showing a connector arranged between the printed circuit board and the intermediate circuit board shown in FIG. 8. FIG. 8 shows an example in which the principle of the present invention is applied to the Y-electrodes 18y and the sustain pulse generating circuits 28 and 30.

In FIGS. 8 and 9, the first and second sustain pulse generating circuits 28 and 30 for the Y-electrodes 18y are mounted on a printed circuit board 46. The scanning circuit 32 shown in FIG. 3 is divided into the first and second scanning circuits 32A and 32B in FIG. 8. The first 32A and the second scanning circuits 32A and 32B correspond to the intermediate circuit board of the present invention. That is, the first and second sustain pulse generating circuits 28 and 30 are connected to the Y-electrodes 18y on the glass substrate 14 via the printed circuit board 46 and the first and second scanning circuits 32A and 32B (and the flexible printed circuit boards 41).

Each of the first and second scanning circuits 32A and 32B is provided with several scanning drivers 48, and each scanning driver 48 is provided with a ground terminal (GND) and a high voltage terminal (HVcc). The first sustain pulse generating circuit 28 is referred to as an L side circuit and connected to the high voltage terminal (HVcc). The second sustain pulse generating circuit 30 is referred to as an H side circuit and connected to the ground terminal (GND). In this case, a portion of the terminals connected to the first sustain pulse generating circuit 28 are connected to the first scanning circuit 32A, and a remaining portion of the terminals connected to the first sustain pulse generating circuit 28 are connected to the second scanning circuit 32B. A portion of the terminals connected to the second sustain pulse generating circuit 30 are connected to the first scanning circuit 32A, and a remaining portion of the terminals connected to the second sustain pulse generating circuit 30 are connected to the second scanning circuit 32B.

The printed circuit board 46 is a multi-layered printed circuit board having four layers of conductor patterns 46p, 46q, 46r and 46s. The first sustain pulse generating circuit 28 is connected to the first and second layers of conductor patterns 46p and 46q from the top, and the second sustain pulse generating circuit 30 is connected to the third and fourth layers of conductor patterns 46r and 46s from the top. In the present invention, it is preferable that the printed circuit board 46 is a multi-layered printed circuit board having four or not less than four conductor pattern layers. The sustain pulse generating circuits 28 and 30, the printed circuit board 46 and the scanning circuits 32A and 32B are mounted to the chassis 12 shown in FIG. 1.

The printed circuit board 46 and the scanning circuits 32A and 32B are connected to each other by a connector 50. The connector 50 includes connector pins 51a and 51b extending from a base section 51 fixed to the scanning circuit 32A (32B), and connector holes (through-holes) 46a and 46b formed in the printed circuit board 46. The connector hole 46a is connected to one of the first and second layers of conductor pattern 46p and 46q from the top of the printed circuit board 46. Therefore, the connector hole 46a is connected to the first sustain pulse generating circuit 28 via the conductor pattern layer. In the same manner, the connector hole 46b is connected to one of the third and fourth layers of conductor patterns 46r and 46s from the top of the printed circuit board 46. Therefore, the connector hole 46b is connected to the second sustain pulse generating circuit 30 via the conductor pattern layer.

As can be seen in FIG. 9, the connector 50 includes a first set of terminals 51a–46a connected to the first sustain pulse generating circuit 28, and a second set of terminals 51b–46b connected to the second sustain pulse generating circuit 30. The terminals 51a–46a and 51b–46b of the first and second sets are arranged in a row alternately two by two. In this connection, the terminals 51a–46a and 51b–46b of the first and second sets may be arranged in a row alternately one by one.

In FIG. 8, an arrow 52 indicates a line path, regarding a specific Y-electrode 18y, which extends from the first sustain pulse generating circuit 28 to the Y-electrode 18y of the glass substrate 14 via the printed circuit board 46, the connector 50 and the scanning circuit 32A. In the present invention, the length of the conductor line connected to the specific Y-electrode 18y is not increased. Therefore, the impedance is not increased, either. Since the multi-layered printed circuit board 46 having four layers of conductor pattern is used, the impedance can be decreased.

Figure 10:
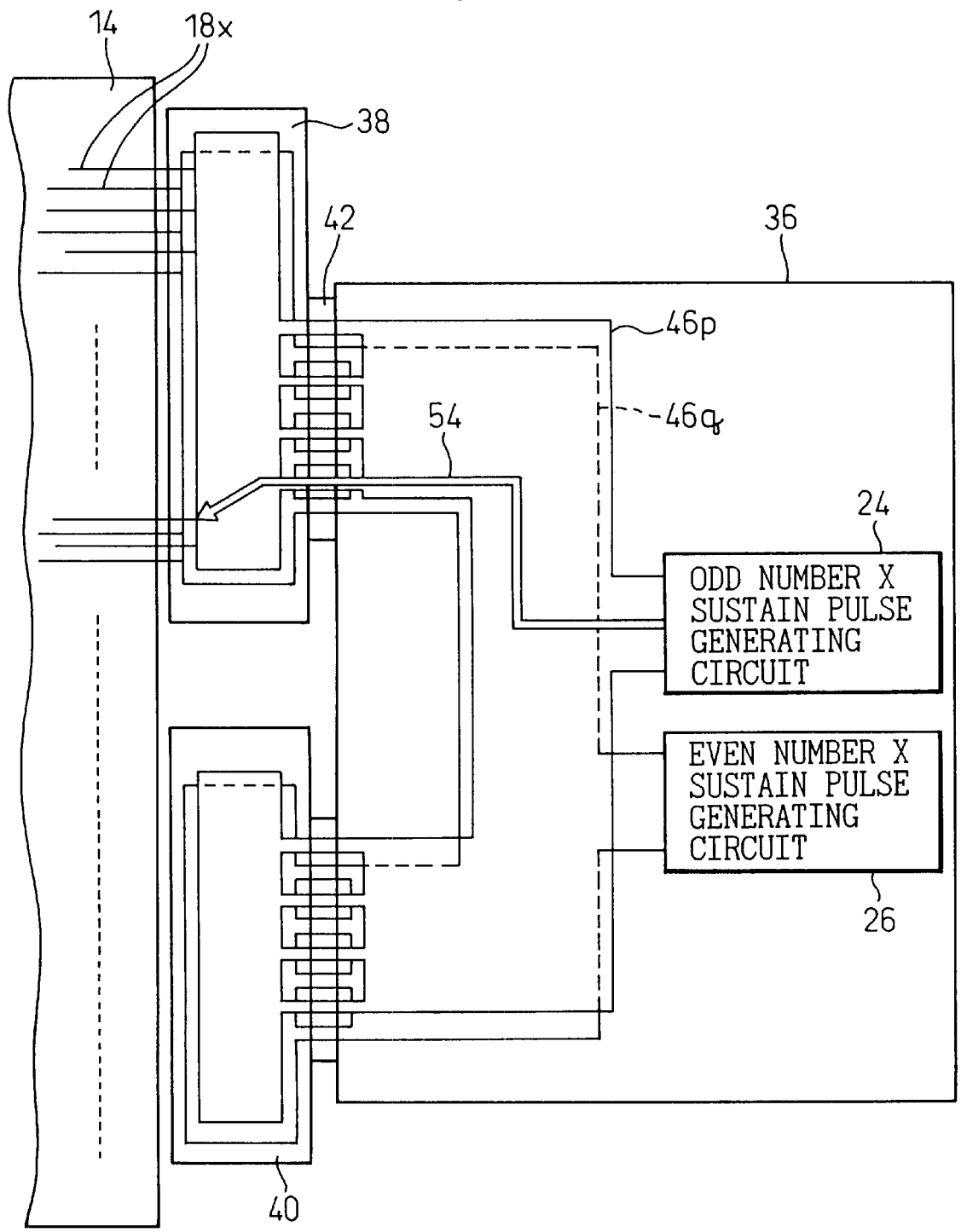
FIG. 10 is a view showing a variation of the device shown in FIG. 4.

FIG. 10 is a view showing a modification of the device shown in FIG. 4. Also in this example, the first and second sustain pulse generating circuits 24 and 26 for the X-electrodes 18x are mounted to the printed circuit board 36. The printed circuit board 36 is connected to the first and second intermediate circuit boards 38 and 40 by the connectors 42. The connector 42 has terminals identical to those shown in FIG. 5, which are arranged in a row alternately.

In this example, the printed circuit board 36 is a multi-layered printed circuit board having two layers of conductor pattern 46p and 46q. The first sustain pulse generating circuit 24 is connected to the first layer of conductor pattern 46p from the top, and the second sustain pulse generating circuit 26 is connected to the second layer of conductor pattern 46q from the top. In this structure, the length of the conductor line connected to the specific X-electrode 18x is not increased. Therefore, the impedance is not increased, either.

Figure 12:
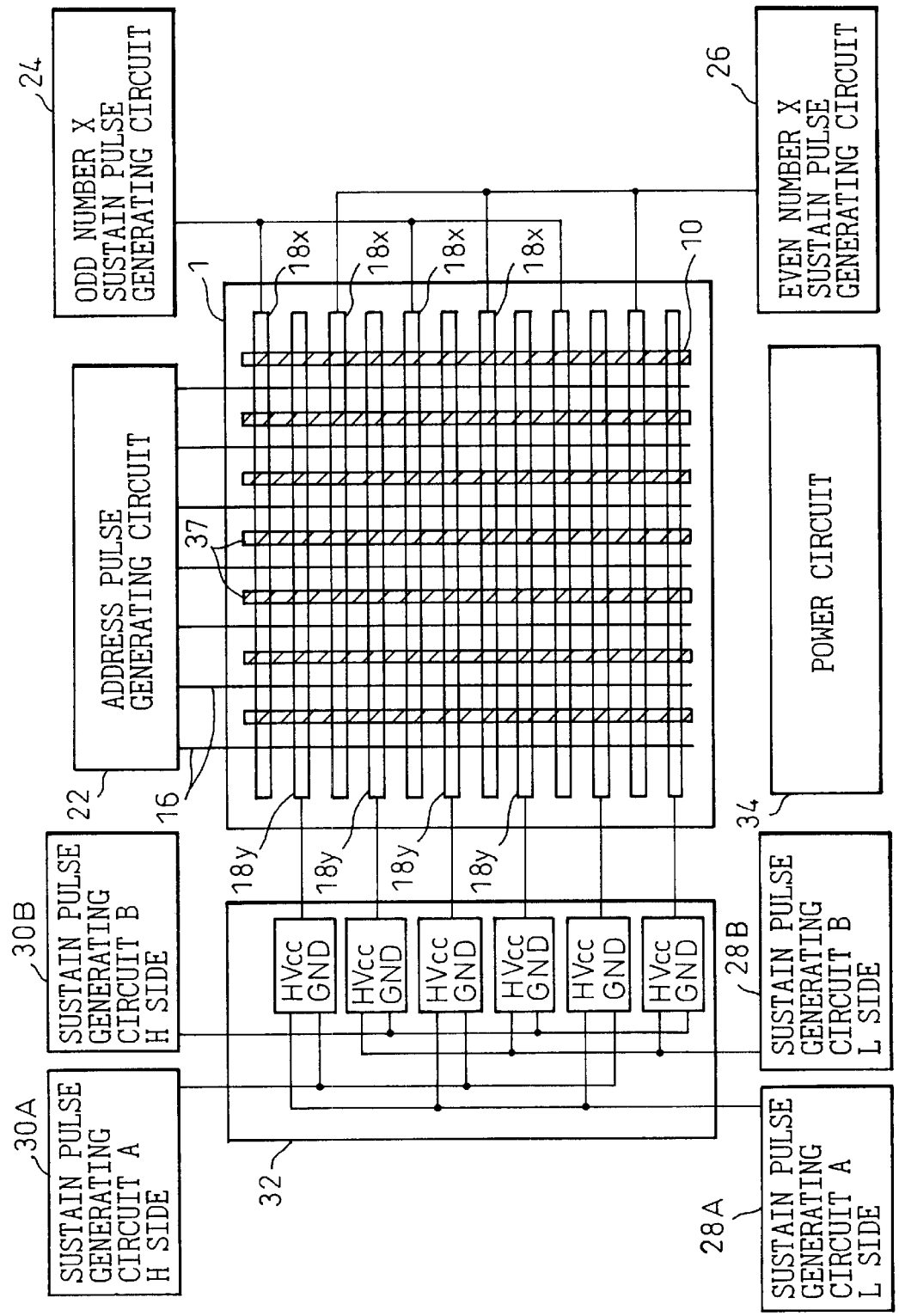
FIG. 12 is a view showing address electrodes, sustain electrodes and sustain pulse generating circuits of a variation of the plasma display device shown in FIGS. 1 and 2.

FIG. 12 is a view showing address electrodes, sustain electrodes and sustain pulse generating circuits of the plasma display device, in which the Y-electrodes are classified into odd number Y-electrodes, and even number Y-electrodes in the same manner as that of X-electrodes.

Figure 11:
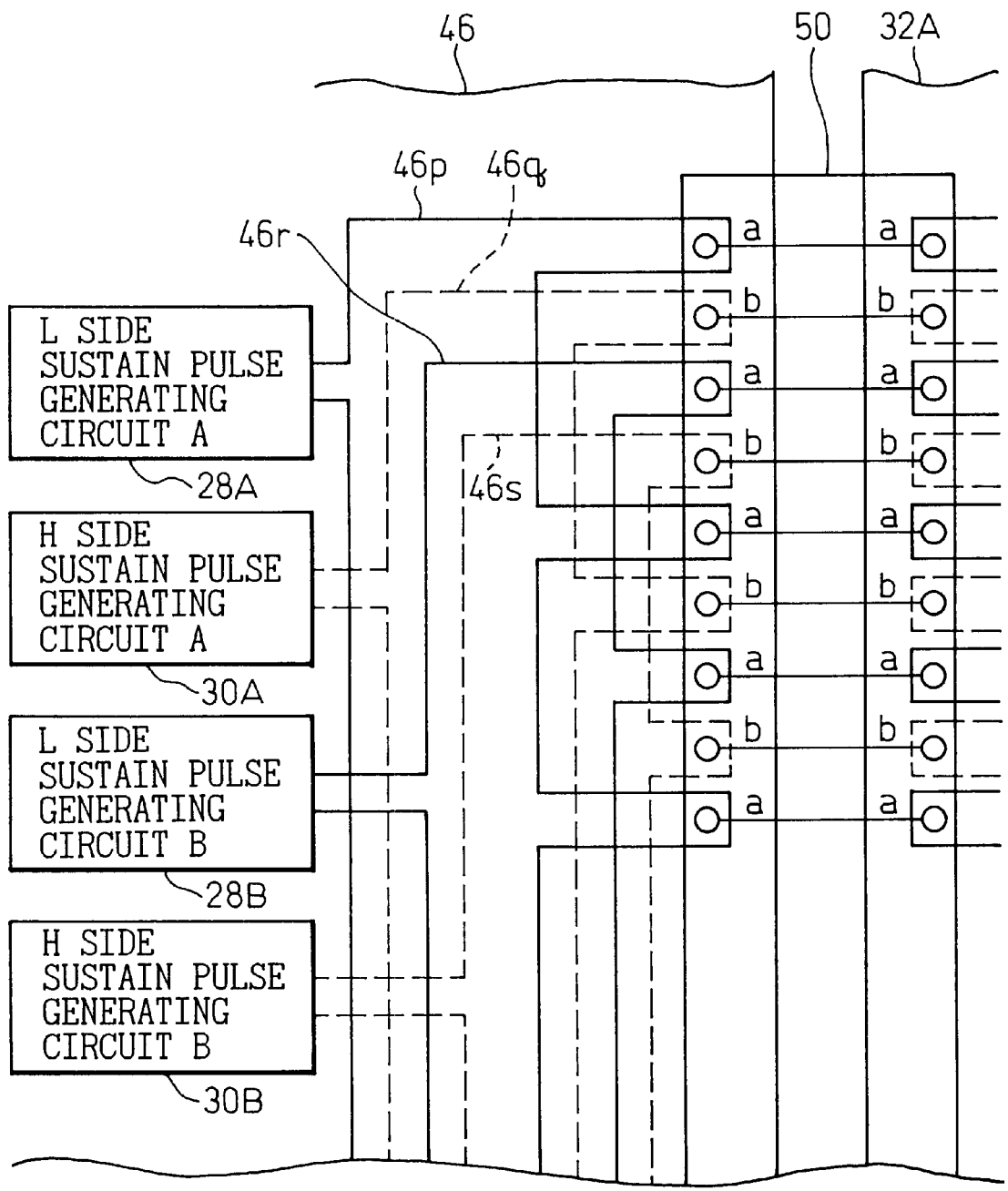
FIG. 11 is a view showing a variation of the device shown in FIG. 8.

FIG. 11 is a view showing a variation of the device illustrated in FIG. 8. In this example, in the same manner as that shown in FIG. 12, the first sustain pulse generating circuit 28 for the Y-electrode 18y is divided into a sustain pulse generating circuit portion 28A for the odd number electrodes and a sustain pulse generating circuit portion 28B for the even number electrodes. The second sustain pulse generating circuit 30 for the Y-electrodes 18y is divided into a sustain pulse generating circuit portion 30A for the odd number electrodes and a sustain pulse generating circuit portion 30B for the even number electrodes. Due to the foregoing, it is possible to apply different voltages to the odd number Y-electrode 18y and the even number Y-electrode 18y. Four sustain pulse generating circuit portions 28A, 28B, 30A and 30B are mounted to the printed circuit board 46.

The printed circuit board 46 is a multi-layered printed circuit board having four layers of conductor patterns 46p, 46q, 46r and 46s. The uppermost conductor pattern layer 46p is allotted to the sustain pulse generating circuit portion 28A, the second conductor pattern layer 46q is allotted to the sustain pulse generating circuit portion 30A, the third conductor pattern layer 46r is allotted to the sustain pulse generating circuit portion 28B, and the fourth conductor pattern layer 46s is allotted to the sustain pulse generating circuit portion 30B.

The first and second scanning circuits 32A and 32B (the second scanning circuit 32B is not shown in FIG. 11), which correspond to the intermediate circuit boards of the present invention, are connected to the printed circuit board 46 via the connectors 50. As shown in FIG. 9, the connector 50 includes a first set of terminals 51a–46a, and a second set of terminals 51b–46b. The terminals 51a–46a and terminals 51b–46b of the first and second sets are arranged in a row alternately one by one. The terminals 51a–46a and 51b–46b may be arranged in a row alternately.

Due to the above structure, the length of the conductor line connected to the specific Y-electrode 18y is not increased. Therefore, the impedance is not increased, either.

Since the multi-layered printed circuit board 46 having four layers of conductor pattern is used, wiring of the conductor pattern can be arranged without causing any problems, and the impedance can be decreased.

As explained above, according to the plasma display device of the present invention, it is possible to enhance the quality of display by reducing the fluctuation of impedance.

What is claimed is:

1. A plasma display device comprising:
    a plasma display panel having at least a plurality of sustain electrodes to emit light;
    a printed circuit board having a first sustain pulse generating circuit supplying a first sustain discharge pulse to a first group of electrodes in said sustain electrodes and a second sustain pulse generating circuit supplying a second sustain discharge pulse to a second group of electrodes in said sustain electrodes; and
    at least one intermediate circuit board arranged between the printed circuit board and the plasma display panel to connect the sustain pulse generating circuits to the sustain electrodes;
    wherein the printed circuit board and said at least one intermediate circuit board are electrically connected to each other by at least one connector, said at least one connector including a first set of terminals connected to the first sustain pulse generating circuit and a second set of terminals connected to the second sustain pulse generating circuit, the terminals of the first set and the terminals of the second set being arranged in a row alternately, one terminal of the first set by one terminal of the second set, or being arranged in the row alternately in two or more groups of terminals of the first set and in two or more groups of terminals of the second set, one group of the terminals of the first set by one group of the terminals of the second set, each group including two or more adjacent terminals of one of the first and second sets of terminals.

2. The plasma display device according to claim 1, wherein said at least one intermediate circuit board comprises a first intermediate circuit board having terminals to which a part of the terminals connected to the first sustain pulse generating circuit and a part of the terminals connected to the second sustain pulse generating circuit are connected, and a second intermediate circuit board having terminals to which a remaining part of the terminals connected to the first sustain pulse generating circuit and a remaining part of the terminals connected to the second sustain pulse generating circuit are connected.

3. The plasma display device according to claim 2, wherein the at least one connector comprises:
    a base section attached to the at least one intermediate circuit board; and
    a plurality of connector pins extending from the base section and electrically connecting the first and second sustain pulse generating circuits to the at least one intermediate circuit boards.

4. The plasma display device according to claim 2, further comprising at least one flexible printed circuit board connecting the first and second pulse generating circuits to the printed circuit board.

5. The plasma display device according to claim 1, wherein the at least one connector comprises:
    a base section attached to the at least one intermediate circuit board; and
    a plurality of connector pins extending from the base section and electrically connecting the first and second sustain pulse generating circuits to the at least one intermediate circuit board.

6. The plasma display device according to claim 1, wherein the group by group arrangement is two consecutive terminals of the first set and two consecutive terminals of the second set.

7. The plasma display device according to claim 1, further comprising at least one flexible printed circuit board connecting the first and second pulse generating circuits to the printed circuit board.

8. A plasma display device comprising:
    a plasma display panel having at least a plurality of sustain electrodes to emit light;
    a printed circuit board having a first sustain pulse generating circuit supplying a first sustain discharge pulse to a first group of electrodes in said sustain electrodes and a second sustain pulse generating circuit supplying a second sustain discharge pulse to a second group of electrodes in said sustain electrodes; and
    at least one intermediate circuit board arranged between the printed circuit board and the plasma display panel to connect the sustain pulse generating circuits to the sustain electrodes;
    wherein the printed circuit board and said at least one intermediate circuit board are connected to each other by at least one connector, said at least one connector including a first set of terminals connected to the first sustain pulse generating circuit and a second set of terminals connected to the second sustain pulse generating circuit, the terminals of the first set and the terminals of the second set are arranged in a row alternately one by one or group by group; and
    wherein the printed circuit board comprises a multi-layered printed board having a first multi-layered conductor pattern connected to the first sustain pulse generating circuit and a second multi-layer conductor pattern connected to the second sustain pulse generating circuit.

9. The plasma display device according to claim 8, wherein the multi-layer printed circuit board includes four or more than four conductor pattern layers.

10. The plasma display device according to claim 8, wherein the at least one connector comprises:
    a base section attached to the at least one intermediate circuit board; and
    a plurality of connector pins extending from the base section and electrically connecting the first and second sustain pulse generating circuits to the at least one intermediate circuit board.

11. The plasma display device according to claim 10, wherein each of the plurality of connector pins are electrically connected to the sustain pulse generating circuits by one of the first multi-layered conductor pattern connected to the first sustain pulse generating circuit and the second multi-layer conductor pattern connected to the second sustain pulse generating circuit.

12. A plasma display device comprising:
    a plasma display panel having at least a plurality of sustain electrodes to emit light;
    a printed circuit board having a first sustain pulse generating circuit supplying a first sustain discharge pulse to a first group of electrodes in said sustain electrodes and a second sustain pulse generating circuit supplying a second sustain discharge pulse to a second group of electrodes in said sustain electrodes; and
    at least one intermediate circuit board arranged between the printed circuit board and the plasma display panel to connect the sustain pulse generating circuits to the sustain electrodes;

wherein the printed circuit board and the at least one intermediate circuit board are connected to each other by at least one connector, the at least one connector including a first set of terminals connected to the first sustain pulse generating circuit and a second set of terminals connected to the second sustain pulse generating circuit, the terminals of the first set and the terminals of the second set are arranged in a row alternately, one terminal of the first set by one terminal of the second set, or being arranged in the row alternately in two or more groups of terminals of the first set and in two or more groups of terminals of the second set, one group of the terminals of the first set by one group of the terminals of the second set, each group being two or more adjacent terminals of one of the first and second sets of terminals; and wherein the printed circuit board comprises a multi-layered printed board having a first layer conductor pattern connected to the first sustain pulse generating circuit and a second layer conductor pattern connected to the second sustain pulse generating circuit.

13. A plasma display device including a plasma display panel having a plurality of sustain electrodes to emit light, a printed circuit board having a plurality of sustain pulse generating circuits, respectively, supplying sustain discharge pulse to respective groups of the sustain electrodes, comprising:

at least one connector including plural sets of terminals, respectively, connected to the plurality of sustain pulse generating circuits, the terminals of the plural sets being arranged in a row in a repeating and alternating sequence group by group, each group including a common number of adjacent terminals of one of the plural sets of terminals; and at least one intermediate circuit board operationally connecting the plurality of sustain pulse generating circuits to the sustain electrodes by the at least one connector.

14. The plasma display device according to claim 13, wherein the printed circuit board comprises a printed board having plural single-layered conductor patterns or plural multi-layered conductor patterns, each of the plural single-layered conductor patterns or the plural multi-layered conductor patterns connected to a corresponding one of the plurality of the sustain pulse generating circuits.

15. The plasma display device according to claim 14, the printed circuit board includes four or more than four conductor pattern layers.

16. A plasma display device including a plasma display panel having a plurality of sustain electrodes to emit light, a printed circuit board having a plurality of sustain pulse generating circuits, respectively, supplying sustain discharge pulse to respective groups of the sustain electrodes, comprising:

at least one connector including plural sets of terminals, respectively, connected to the plurality of sustain pulse generating circuits, the terminals of the plural sets being arranged in a row in a repeating and alternating sequence group by group, each group including a common number of adjacent terminals of one of the plural sets of terminals; and plural intermediate circuit boards, each having terminals, a part of the terminals of each of the plural intermediate circuit boards connected to respective sustain pulse generating circuits and a remaining part of the terminals of each of the plural intermediate circuit boards connected to second respective sustain pulse generating circuits, each of the plural intermediate circuit boards being arranged between the printed circuit board and the plasma display panel to connect the plurality of the sustain pulse generating circuits to the sustain electrodes, the printed circuit board and the plural intermediate circuit boards are connected to each other by the at least one connector.

17. The plasma display device according to claim 16, wherein the printed circuit board comprises a printed board having plural single-layered conductor patterns or plural multi-layered conductor patterns, each of the plural single-layered conductor patterns or the plural multi-layered conductor patterns connected to a corresponding one of the plurality of sustain pulse generating circuits.

18. The plasma display device according to claim 16, the printed circuit board includes four or more than four conductor pattern layers.

19. A plasma display device comprising:

a plasma display panel having at least a plurality of sustain electrodes to emit light;

a printed circuit board having a first sustain pulse generating circuit supplying a first sustain discharge pulse to a first group of electrodes in said sustain electrodes and a second sustain pulse generating circuit supplying a second sustain discharge pulse to a second group of electrodes in said sustain electrodes; and at least one intermediate circuit board arranged between the printed circuit board and the plasma display panel to connect the sustain pulse generating circuits to the sustain electrodes;

wherein the printed circuit board and said at least one intermediate circuit board are connected to each other by at least one connector, said at least one connector including a first set of terminals connected to the first sustain pulse generating circuit and a second set of terminals connected to the second sustain pulse generating circuit, the terminals of the first set and the terminals of the second set being arranged in a row alternately, one terminal of the first set by one terminal of the second set, or being arranged in the row alternately in two or more groups of terminals of the first set and in two or more groups of terminals of the second set, one group of the terminals of the first set by one group of the terminals of the second set, each group including two or more adjacent terminals of one of the first and second sets of terminals;

wherein said at least one intermediate circuit board comprises a first intermediate circuit board having terminals to which a part of the terminals connected to the first sustain pulse generating circuit and a part of the terminals connected to the second sustain pulse generating circuit are connected, and a second intermediate circuit board having terminals to which a remaining part of the terminals connected to the first sustain pulse generating circuit and a remaining part of the terminals connected to the second sustain pulse generating circuit are connected.

* * * * *